United States Patent
Chen et al.

(10) Patent No.: US 9,215,804 B2
(45) Date of Patent: Dec. 15, 2015

(54) CIRCUIT STACK STRUCTURE

(71) Applicant: HannStar Display Corporation, New Taipei (TW)

(72) Inventors: Yung-Fu Chen, Tainan (TW); Rong-Bing Wu, Kaohsiung (TW); Po-Hsiao Chen, Yunlin County (TW); Chien-Hao Wu, Tainan (TW)

(73) Assignee: HANNSTAR DISPLAY CORPORATION, New Taipei (TW)

( * ) Notice: Subject to any disclaimer, the term of this patent is extended or adjusted under 35 U.S.C. 154(b) by 485 days.

(21) Appl. No.: 13/846,782

(22) Filed: Mar. 18, 2013

(65) Prior Publication Data

US 2014/0138123 A1 May 22, 2014

(30) Foreign Application Priority Data

Nov. 21, 2012 (CN) .......................... 2012 1 0477163

(51) Int. Cl.
*H05K 1/11* (2006.01)
*H05K 3/28* (2006.01)
*H05K 1/03* (2006.01)
*H05K 1/18* (2006.01)

(52) U.S. Cl.
CPC .. *H05K 1/11* (2013.01); *H05K 3/28* (2013.01); *H05K 1/0306* (2013.01); *H05K 1/189* (2013.01); *H05K 2201/09227* (2013.01)

(58) Field of Classification Search
USPC ............................................. 174/120 R, 251
See application file for complete search history.

(56) References Cited

U.S. PATENT DOCUMENTS

| | | | |
|---|---|---|---|
| 4,281,208 A * | 7/1981 | Kuwano | H01L 31/022466 136/244 |
| 6,458,608 B1 | 10/2002 | Hong | |
| 6,636,279 B2 | 10/2003 | Takasugi et al. | |
| 6,862,069 B2 * | 3/2005 | Kwak | G02F 1/1345 349/143 |
| 6,940,301 B2 * | 9/2005 | Chen | G01R 27/205 324/760.01 |
| 7,265,804 B2 * | 9/2007 | Chen | G02F 1/13452 349/149 |
| 7,349,053 B2 * | 3/2008 | Lee | G02F 1/1339 349/143 |
| 7,485,907 B2 * | 2/2009 | Lee | G02F 1/1345 257/291 |
| 7,489,382 B2 | 2/2009 | Chen | |
| 7,580,086 B2 | 8/2009 | Lee et al. | |
| 7,728,945 B2 | 6/2010 | Liu et al. | |
| 8,059,250 B2 | 11/2011 | Lee | |
| 2005/0248706 A1 | 11/2005 | Lee | |
| 2011/0181786 A1 * | 7/2011 | Yamazaki | G09G 3/2077 348/671 |

FOREIGN PATENT DOCUMENTS

TW 432564 5/2001

* cited by examiner

*Primary Examiner* — Timothy Thompson
*Assistant Examiner* — Krystal Robinson
(74) *Attorney, Agent, or Firm* — CKC & Partners Co., Ltd.

(57) ABSTRACT

A circuit stack structure is provided. The circuit stack structure includes a conductor layer having metal wires arranged at intervals, propping portions respectively disposed in a gap between any two of the neighboring metal wires, and a protective layer covering the metal wires and the propping portions. The propping portions are electrically isolated with the metal wires. With supporting by the propping portions, all regions of a top surface of the protective layer corresponding to one of the propping portions are coplanar with all regions of the top surface of the protective layer corresponding to each of the metal wires.

20 Claims, 12 Drawing Sheets

CIRCUIT STACK STRUCTURE

RELATED APPLICATIONS

This application claims priority to Chinese application no. 201210477163.X filed Nov. 21, 2012, the entirety of which is incorporated herein by reference.

BACKGROUND

1. Field of Invention

The invention relates to a circuit stack structure. More particularly, the invention relates to a circuit stack structure of a circuit stack structure of an active component array substrate.

2. Description of Related Art

FIG. 1 is a partially top view of a known active component array substrate 10. As shown in FIG. 1, the active component array substrate 10 includes a glass substrate 20, a driver chip 30, a plurality of data lines 40 and a plurality of scan lines 50. The data lines 40, the scan lines 50 and the driver chip 30 are all disposed on the glass substrate 20. The driver chip 30 is coupled to the data lines 40 and the scan lines 50, also, the driver chip 30 is connected to a flexible printed circuit (FPC) pad area 80 through a transition line area 60 on the glass substrate 20. The transition line area 60 is disposed between the driver chip 30 and the FPC pad area 80, and wires in the transition line area 60 extend from the FPC pad area 80 to the driver chip 30, so as to exchange signals between the driver chip 30 and the FPC pad area 80. However, since the transition line area 60 has no scratch-proof design, damage by scratching on the transition line area 60 is often happened.

FIG. 2 is a cross-sectional view of FIG. 1 along a line 2-2. As shown in FIG. 2, in particular the transition line area 60 includes a circuit stack structure 70 configured on the glass substrate 20, which sequentially includes a insulation layer 71, a conductor layer (e.g., metal) 72 and a protective layer (e.g., passivation) 75 from down to up. The conductor layer 72 includes a plurality of metal wires 73 arranged at intervals on the insulation layer 71, and the protective layer 75 covers the conductor layer 72. Since a gap 74 is disposed between any two adjacent metal wires 73, after forming the protective layer 75, a convex portion 76 and a concave portion 77 are molded in the protective layer 75 respectively corresponding to the convex-concave characteristic of the metal wires 73 and the gap 74 disposed therebetween.

However, since the convex portion 76 and the concave portion 77 on the circuit stack structure 70 has various differences in shape, such as differences in height or contact area, when the protective layer 75 of the transition line area 60 is scratched by a hard object, the concave portion 77 may easily become the stress-concentrated point, or alternatively the convex portion 76 is subjected to too large friction force. As such, the wiring of the conductor layer 72 cannot be protected efficiently and the damage risk of the conductor layer 72 is increased, which further increases the manufacture or maintain cost.

SUMMARY

The invention provides an active component array substrate and a circuit stack structure thereof, so as to minimize differences between a convex portion and a concave portion on a transition line area (such as differences in height or contact area), thereby reducing a damage to the transition line area as scratched by a hard object, and reducing the damage risk of the wiring in the transition line area.

In an embodiment of the invention, such an active component array substrate includes a glass substrate, a driver chip, a flexible printed circuit (FPC) pad area and a transition line area. The driver chip is disposed on the glass substrate. The flexible printed circuit (FPC) pad area is also disposed on the glass substrate. The transition line area is disposed between the driver chip and the FPC pad area, including a circuit stack structure. The circuit stack structure is divided into multiple first and second areas which are alternatively arranged along a surface of the glass substrate. The circuit stack structure includes a first conductor layer, multiple first propping portions and a protective layer. The first conductor layer is overlapped on the glass substrate, including multiple first metal wires arranged at intervals. Each of the first metal wires is consistent with the range of one of the first areas and connects the FPC pad area with the driver chip. The area range of a gap between any two adjacent first metal wires is consistent with the range of one of the second areas. The first propping portions are respectively disposed in the second areas and are electrically isolated with the first metal wires, the FPC pad area and the driver chip. The protective layer covers the first conductor layer and the first propping portions. As such, with supporting by the first propping portions, the top surface of the protective layer in the first areas is coplanar with the top surface of the protective layer in the second areas.

Since these first propping portions are accommodated in gaps between any two adjacent first metal wires, after form of the protective layer, the top surface of the protective layer in the second areas approximately has a equal height with the top surface of the protective layer in the first areas. As such, the concave portion generated corresponding to the gap between any two adjacent metal wires in the foregoing known structure, so that the difference in height between the convex portion and the concave portion in the foregoing known structure is reduced. Therefore, the characteristic that the concave portion in the transition line area becomes the stress-Concentrated point in the foregoing known structure can be eliminated, so as to protect the wiring from the risk of scratch and improve the qualified rate.

In another embodiment of the invention, such an active component array substrate includes a glass substrate, a driver chip, a flexible printed circuit (FPC) pad area and a transition line area. The driver chip is disposed on the glass substrate. The flexible printed circuit (FPC) pad area is also disposed on the glass substrate. The transition line area is disposed between the driver chip and the FPC pad area, including a circuit stack structure. The circuit stack structure includes a third insulation layer, a first conductor layer, multiple sixth propping portions and a protective layer. The third insulation layer is disposed on the glass substrate. The first conductor layer is overlapped on the glass substrate, including multiple first metal wires arranged at intervals. Each of the first metal wires connects the FPC pad area and the driver chip. The sixth propping portions having long and narrow shapes are arranged in parallel with each other on the third insulation layer, and are electrically isolated with the first metal wires, the FPC pad area and the driver chip. The protective layer covers the first conductor layer and the sixth propping portions, so that a top surface of the protective layer is provided with multiple convex portions corresponding to these sixth propping portions.

Since these sixth propping portions are accommodated at intervals in the circuit stack structure and an uneven surface can be formed on the top surface of the formed protective layer by means of the height differences among these sixth propping portions, the friction differences between the convex portion and the concave portion in the foregoing structure are reduced. Therefore, the friction force caused by scratch of a hard object is reduced, so as to protect the wiring from the risk of scratch and improve the qualified rate.

In a further embodiment of the invention, such an active component array substrate includes a glass substrate, a driver chip, a flexible printed circuit (FPC) pad area and a transition line area. The driver chip is disposed on the glass substrate. The flexible printed circuit (FPC) pad area is also disposed on the glass substrate. The transition line area is disposed between the driver chip and the FPC pad area, including a circuit stack structure. The circuit stack structure includes a first conductor layer, a fourth insulation layer, a second conductor layer and a protective layer. The first conductor layer includes multiple first metal wires. The first metal wires are arranged at intervals on the glass substrate and connect the FPC pad area and the driver chip. The fourth insulation layer covers the glass substrate and the first metal wire, including multiple through openings arranged at intervals on the insulation layer. The through opening only exposes the first metal wires. The second conductor layer includes multiple second metal wires. The second metal wires are arranged at intervals on the fourth insulation layer. Each of the second metal wires accommodated in the through opening and contacts a corresponding first metal wire in the through opening. The protective layer covers the fourth insulation layer and the second metal wires, so that multiple concave openings respectively aligned with the through openings are formed on a top surface of the protective layer.

Since multiple through openings are formed on the fourth insulation layer, the formed second metal wires and the top surface of the protective layer all have uneven surfaces corresponding to these through openings. Therefore the differences in contact area between the convex portion and the concave portion in the foregoing known structure are reduced and the contact area of the protective layer scratched by a hard object is also reduced, so as to protect the wiring from the risk of scratch and improve the qualified rate. Furthermore, since each of the second metal wires is electrically connected with one first metal wire, the current applied to the transition line area can evenly pass through the first metal wires and the second metal wires, so as to reduce the resistance.

In view of the above, the invention can minimize the differences between the convex portion and the concave portion on the transition line area of the foregoing known structure, the friction force due to scratch by the hard object is reduced, which is beneficial to protect the wiring from the risk of scratch, improve the qualified rate, and avoid increase of the manufacture or maintain cost.

BRIEF DESCRIPTION OF THE DRAWINGS

In order to make the foregoing as well as other aspects, features, advantages, and embodiments of the invention more apparent, the accompanying drawings are described as follows.

DETAILED DESCRIPTION

The spirit of the invention will be described clearly through the drawings and the detailed description as follows. Any of those of ordinary skills in the art can make modifications and variations from the technology taught in the invention after understanding the embodiments of the invention, without departing from the sprite and scope of the invention.

The invention provides an active component array substrate and a circuit stack structure thereof, so as to minimize differences between a convex portion and a concave portion in a foregoing known structure (such as differences in height, friction or contact area), thereby reducing a damage to the transition line area as scratched by a hard object, and reducing the damage risk of the wiring in the transition line area.

Some embodiments are disclosed according to the above description, so as to illustrate the spirit that the invention minimizes the differences between the convex portion and the concave portion in the foregoing known structure. However, the embodiments of the specification are only used for illustration, and the invention is not limited to these. A designer can select appropriate technical means to achieve the differences between the convex portion and the concave portion in the foregoing known structure based on the above-mentioned spirit.

Figure 3:
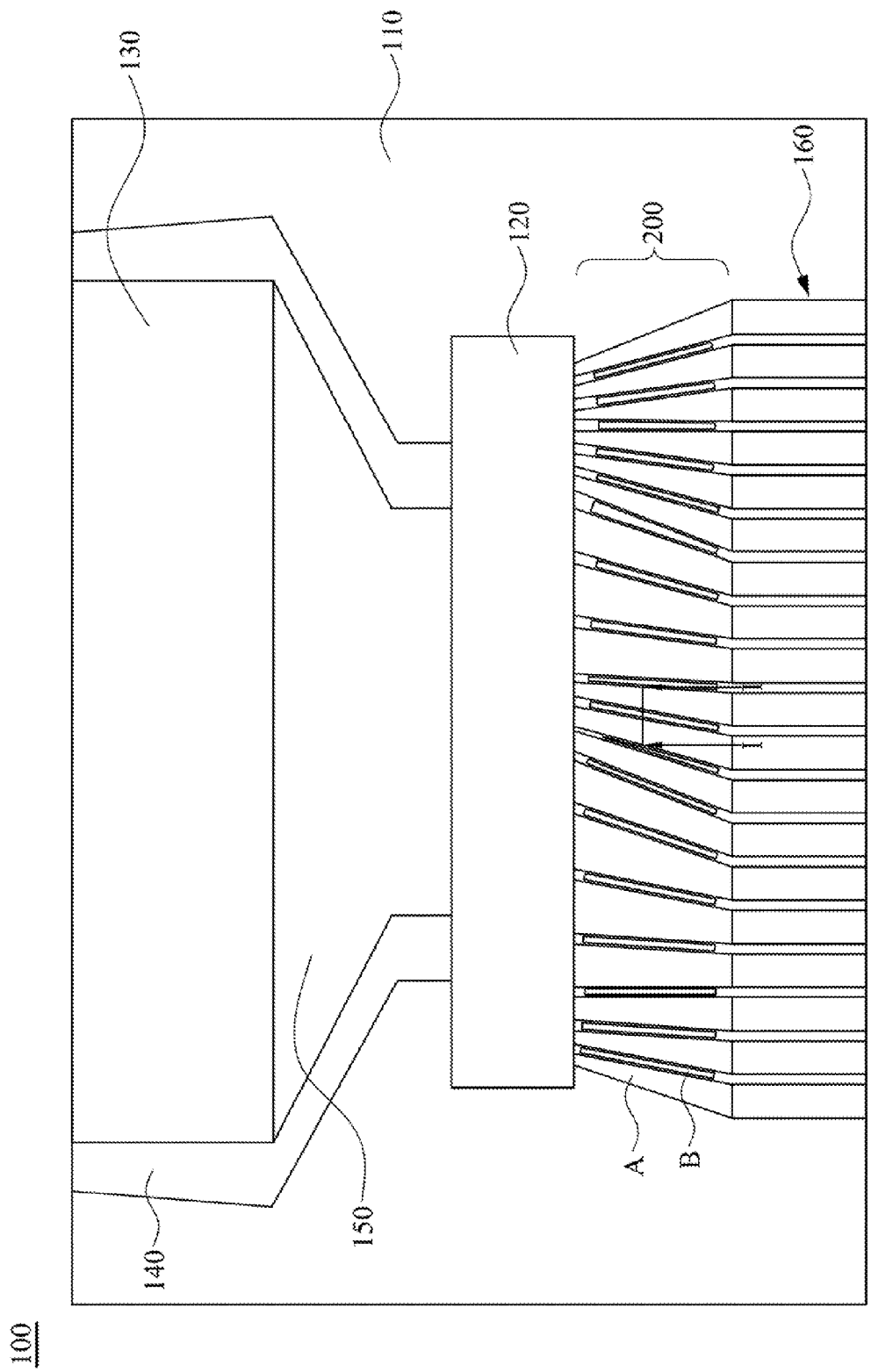
FIG. 3 is a partially top view of an active component array substrate according to an embodiment of the invention.

FIG. 3 is a partially top view of an active component array substrate 100 according to an embodiment of the invention.

Figure 1:
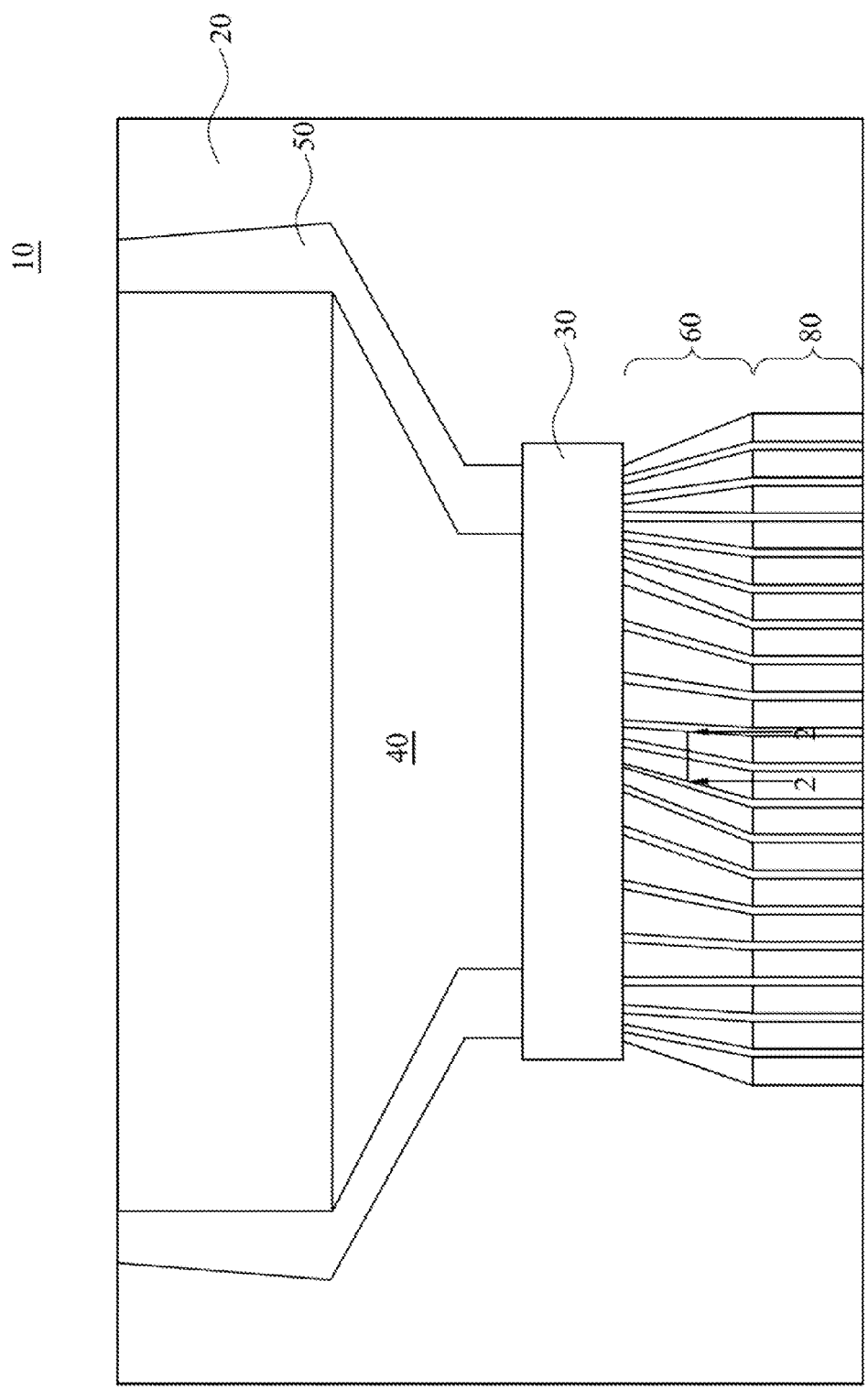
FIG. 1 is a partially top view of a conventional active component array substrate.
Figure 2:
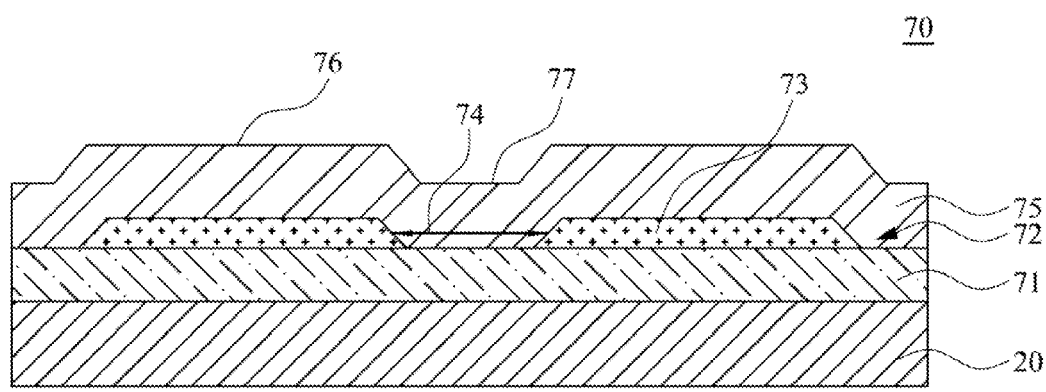
FIG. 2 is a cross-sectional view of FIG. 1 along a line 2-2.

Referring to FIGS. 1 and 3, the active component array substrate 100 includes a glass substrate 110, a driver chip 120, a pixel array 130, a scan line area (scan lines) 140, a data line area (source lines or data lines) 150 and a flexible printed circuit pad area (FPC pad) 160. The data line area 150, the scan line area 140, the pixel array 130, the driver chip 120 and the flexible printed circuit pad area 160 are all arranged on the glass substrate 110. The data line area 150 has multiple data lines therein, arranged at one side of the pixel array 130. The scan line area 140 has multiple scan lines therein, which can be divided into two parts respectively positioned at two opposite sides of the data line area 150 and extending towards two sides of the pixel array 130. The data lines (not shown) included in the data line area 150 and the scan lines (not shown) included in the scan line area 140 are all coupled to the same side of the driver chip 120. The FPC pad area 160 is positioned at the other side of the driver chip 120 opposite to the scan line area 140, and is connected to the driver chip 120 through a transition line area 200 on the glass substrate 110. The transition line area 200 is disposed between the driver chip 120 and the FPC pad area 160. Wires in the transition line area 200 extends from the wires connected from the FPC pad area 160 to the driver chip 120, so as to exchange signals between the driver chip 120 and the FPC pad area 160.

Figure 4:
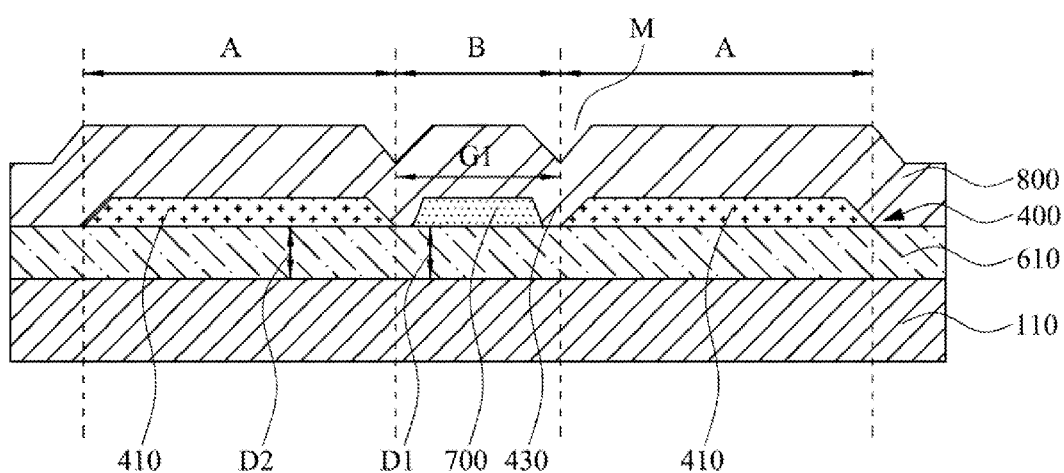
FIG. 4 is a cross-sectional view of the first embodiment of FIG. 3 along a line I-I.

FIG. 4 is a cross-sectional view of the first embodiment of FIG. 3 along a line I-I. Referring to FIGS. 3 and 4, the transition line area 200 includes a circuit stack structure 300. The circuit stack structure 300 is divided into multiple first areas A and second areas B which are alternatively arranged along an extending direction of a main surface of the glass substrate 110. The circuit stack structure 300 includes a first conductor layer 400, a insulation layer (hereafter referred to as a first insulation layer 610 in the first embodiment), multiple first propping portions 700 and a protective layer 800.

The first conductor layer 400 includes multiple first metal wires 410. These first metal wires 410 are arranged at intervals, so that a first gap G1 is disposed between any two adjacent first metal wires 410, and two ends of each of the first metal wires 410 are respectively connected to the FPC pad area 160 and the driver chip 120. The longitudinal range of each of the first areas A is defined as equal to the area of each of the first metal wires 410 extending from the FPC pad area 160 to the driver chip 120. The depth of each of the first areas A is defined as from the outer surface of the protective layer 800 to the inner surface of the glass substrate 110. The longitudinal range of each of the second areas B is defined as equal to the area of any one of the above-mentioned first gaps G1 extending from the FPC pad area 160 to the driver chip 120. The first propping portions 700 are accommodated in the first gaps G1 (i.e., the second areas B) between any two adjacent first metal wires 410, and are electrically isolated with the first metal wire 410, the FPC pad area 160 and the driver chip 120. The first insulation layer 610 is disposed between the protective layer 800 and the glass substrate 110. The protective layer 800 covering the first conductor layer 400, the first insulation layer 610 and these first propping portions 700 is disposed at the outermost side of the circuit stack structure 300 opposite to the glass substrate 110. The top surface of the protective layer 800 in the first areas A is approximately coplanar with the top surface of the protective layer 800 in the second areas B.

As such, the difference in height between the convex portion and the concave portion in the foregoing known structure is reduced, and the problem that the concave portion in the transition line area becomes the stress-concentrated point in the foregoing known structure can be eliminated, so as to protect the wiring from the risk of scratch and improve the qualified rate.

Referring to FIGS. 3 and 4, in the first embodiment, the first insulation layer 610 is disposed on the glass substrate 110, for example directly disposed on the glass substrate 110. The first conductor layer 400 is disposed on the first insulation layer 610. In other words, the first insulation layer 610 is disposed between the first conductor layer 400 and the glass substrate 110, or even the first insulation layer 610 is directly positioned between the first conductor layer 400 and the glass substrate 110.

The first propping portions 700 are disposed in the first conductor layer 400 and are coplanar with the first metal wires 410. That is, the minimum vertical distance D1 from bottom surfaces of the first propping portions 700 to a reference surface (e.g. the top surface of the glass substrate 110) is equal to a minimum vertical distance D2 from bottom surfaces of the first metal wires 410 to the reference surface (e.g. the top surface of the glass substrate 110).

Furthermore, in this embodiment, when the protective layer 800 covers the first insulation layer 610, the first propping portions 700 and the first metal wires 410, the protective layer 800 covers the first propping portions 700 in the second areas B and directly contacts the first insulation layer 610 at two opposite sides of each of the first propping portions 700, so as to avoid physical contact between the first propping portions 700 and the first metal wires 410 disposed at two sides of the first propping portions 700.

During manufacturing, the first insulation layer 610, the first conductor layer 400 (the first metal wires 410 and the first propping portions 700) and the protective layer 800 are sequentially formed on the glass substrate 110. Based on the first propping portions 700 and the first metal wires 410, corresponding convex portions are formed on top surfaces of the formed protective layer 800 in the first areas A and the second areas B, so as to ensure that the top surface of the protective layer 800 in the first areas A is coplanar with the top surface of the protective layer 800 in the second areas B. Furthermore, the protective layer 800 fills concave portion 430 between two opposite sides of the first propping portions 700 and the first metal wires 410 disposed at two sides of the first propping portions 700, so that concave marks M corresponding to the concave portions 430 are also formed on the top surface of the protective layer 800. Therefore, the top surface of the protective layer 800 in the second areas B can be defined between any two adjacent concave marks M on the top surface of the protective layer 800.

It should be understood that, in variations of the embodiment the material of the first propping portions may be conducting metal or non-metal materials, such as semiconductor materials like amorphous silicon, but the invention is not limited to this. The thickness (or height) of each of the first propping portions is equal to the thickness (or height) of each of the first metal wires, but the invention is not limited to this. Each of the first propping portions has a strip shape and is a dummy metal wire pattern (Dummy pattern). The length of each of the first propping portions is smaller than the length of each of the first metal wires extending from the driver chip to the FPC pad area, so as to ensure that the two ends of each of the first propping portions are not connected to the FPC pad area and the driver chip, but the invention is not limited to this.

Figure 5:
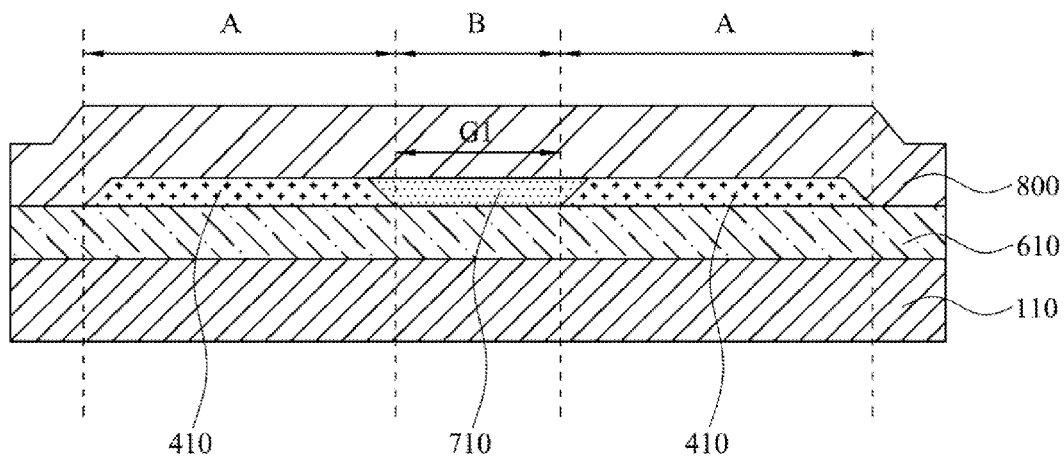
FIG. 5 is a cross-sectional view of a variation of the first embodiment of FIG. 3 along the line I-I.

FIG. 5 is a cross-sectional view of a variation of the first embodiment of FIG. 3 along a line I-I. Referring to FIGS. 3 and 5, based on the characteristic of FIG. 4, in a variation of the first embodiment the first propping portions 710 fill up the first gaps G1 completely and physically contact the first metal wires 410 disposed at two sides thereof. Since the first propping portions 710 are made of non-conducting materials, the first propping portions 710 are electrically isolated with the first metal wires 410 disposed at two sides thereof.

Since the first propping portions 710 fill up the first gaps G1 completely and the first propping portions 710 are coplanar with the first metal wires 410 disposed at two sides thereof, when the protective layer 800 is formed, the top surface of the protective layer 800 in the first areas A is coplanar with the top surface of the protective layer 800 in the second areas B.

It should be understood that, in variations of the embodiment the material of the first propping portions may be isolating or semiconductor materials, such as amorphous silicon, but the invention is not limited to this. The thickness (or height) of each of the first propping portions is equal to the thickness (or height) of each of the first metal wires, but the invention is not limited to this. Each of the first propping portions has a strip shape and is a dummy metal wire pattern (Dummy pattern). The length of each of the first propping portions is smaller than the length of each of the first metal wires extending from the driver chip to the FPC pad area, so as to ensure that the two ends of each of the first propping portions are not connected to the FPC pad area and the driver chip, but the invention is not limited to this.

Figure 6:
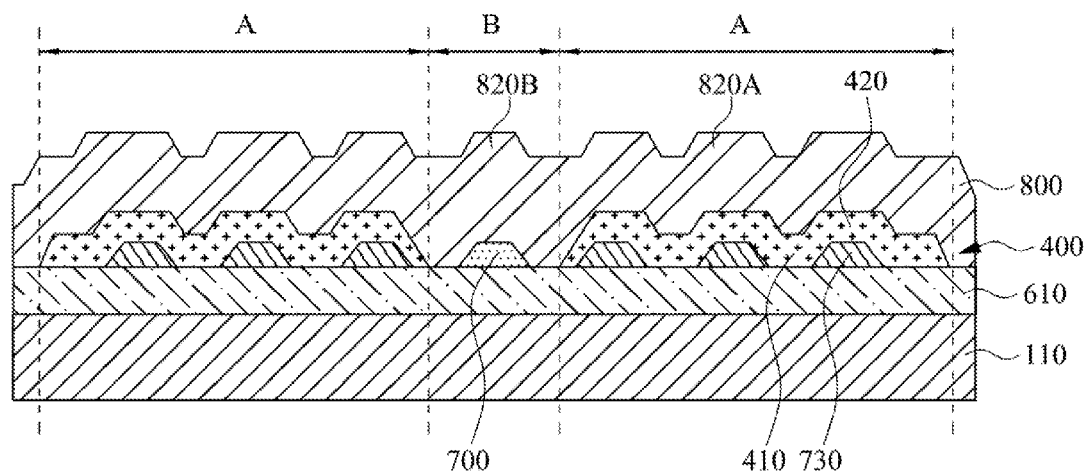
FIG. 6 is a cross-sectional view of the active component array substrate of the invention in another variation of the first embodiment.

FIG. 6 is a cross-sectional view of the active component array substrate of the invention in another variation of the first embodiment. Referring to FIG. 6, In another variation of the first embodiment, the circuit stack structure 300 further includes multiple third propping portions 730 arranged at intervals. These third propping portions 730 are arranged on the first gate insulation layer 610. In this variation, these third propping portions 730 are only disposed in the first areas A of the first insulation layer 610. More particularly, these third propping portions 730 with straight linear shapes are arranged in parallel with each other in the first areas A of the first insulation layer 610, and are covered by the first metal wires 410. That is, these third propping portions 730 are embedded in the first metal wires 410.

During manufacture, the first insulation layer 610, the first conductor layer 400 and the protective layer 800 are sequentially formed on the glass substrate 110. Based on the third propping portions 730, uneven surfaces corresponding to the third propping portions 730 are formed on the top surfaces of the first metal wires 410 and the top surface of the protective layer 800 in the first areas A. For example, multiple convex portions 420 aligned with and corresponding to the third propping portions 730 are formed on top surfaces of the first metal wires 410, and multiple convex portions 820A aligned with and corresponding to the third propping portions 730 are formed on the top surface of the protective layer 800 in the first areas A. Based on the first propping portions 700, a uneven surface corresponding to the first propping portions 700 are formed on the top surface of the protective layer 800 in the second areas B. For example, multiple convex portions 820 B aligned with and corresponding to the first propping portions 700 are formed on the top surface of the protective layer 800 in the second areas B. These convex portions 820A and 820B are arranged at intervals in the first areas A and the second areas B of the protective layer 800, and the top surfaces of the convex portions 820A and 820B are approximately coplanar with each other.

Therefore, since the top surface of the protective layer is formed as an uneven surface, the friction difference between the convex portion and the concave portion of the foregoing known structure can be reduced, so as to reduce the friction force due to scratch by the hard object, protect the wiring from the risk of scratch and improve the qualified rate.

It should be understood that, in the variation of the embodiment the material of the first propping portions may be conducting metal or non-metal materials, such as semiconductor materials like amorphous silicon, but the invention is not limited to this. The thickness (or height) of each of the first propping portions is equal to the thickness (or height) of each of the third propping portions, but the invention is not limited to this. Each of the first propping portions and the third propping portions has a strip shape and is a dummy metal wire pattern (Dummy pattern). The length of each of the first propping portions and the third propping portions is smaller than the length of each of the first metal wires extending from the driver chip to the FPC pad area, so as to ensure that the two ends of each of the first propping portions and the third propping portions are not connected to the FPC pad area and the driver chip, but the invention is not limited to this.

Figure 7:
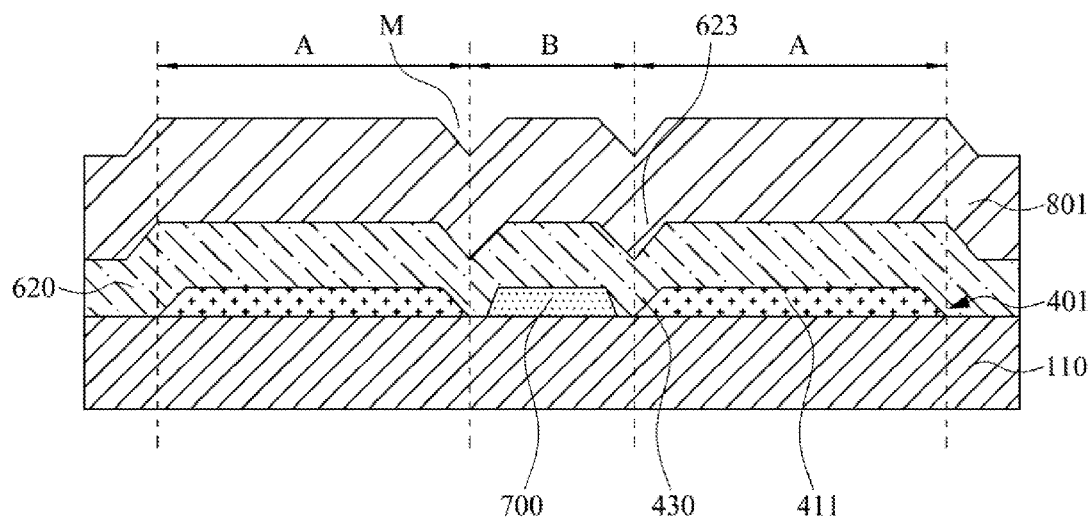
FIG. 7 is a cross-sectional view of a variation of the second embodiment of FIG. 3 along the line I-I.

FIG. 7 is a cross-sectional view of a variation of a second embodiment of FIG. 3 along a line I-I. Referring to FIGS. 3 and 7, In the second embodiment, the first propping portions 700 and the first metal wires 411 are coplanar, and the insulation layer (hereafter referred to as a second insulation layer 620 in the second embodiment) covering the first propping portions 700 and the first metal wires 411 is disposed between the first conductor layer 401 and the protective layer 801.

In a variation of the second embodiment, when the second insulation layer 620 covers the first propping portions 700 in the second areas B, the second insulation layer 620 directly contacts the glass substrate 110 at two opposite sides of the first propping portion 700, so as to avoid physical contact between the first propping portions 700 and the first metal wires 411 disposed at two sides thereof.

Therefore, during manufacturing, the first conductor layer 401 (the first metal wires 411 and the first propping portions 700), the second insulation layer 620 and the protective layer 801 are sequentially formed on the glass substrate 110. Based on the first metal wires 411 and the first propping portions 700, corresponding convex portions are respectively formed on top surfaces of the formed second insulation layer 620 and protective layer 801 in the first areas A and the second areas B, so as to ensure that the top surface of the protective layer 801 in the first areas A is coplanar with the top surface of the protective layer 801 in the second areas B.

Additionally, since the second insulation layer 620 fills the concave portions 430 between the two opposite sides of the first propping portions 700 and the first metal wires 411 disposed at two sides thereof, concave portions 623 aligned with and corresponding to the concave portions 430 are also formed on the top surface of the second insulation layer 620. Therefore, when the protective layer 801 is formed, multiple concave marks M aligned with these concave portions 623 one to one are also formed on the top surface of the protective layer 801. As such, the top surface of the protective layer 801 in the second areas B is defined between any two adjacent concave marks M of the top surface of the protective layer 801.

It should be understood that, in variations of the embodiment the material of the first propping portions may be conducting metal or non-metal materials, such as semiconductor materials like amorphous silicon, but the invention is not limited to this. The thickness (or height) of each of the first propping portions is equal to the thickness (or height) of each of the first metal wires, but the invention is not limited to this. Each of the first propping portions 700 has a strip shape and is a dummy metal wire pattern (Dummy pattern). The length of each of the first propping portions 700 is smaller than the length of each of the first metal wires extending from the driver chip to the FPC pad area, so as to ensure that the two ends of each of the first propping portions are not connected to the FPC pad area and the driver chip, but the invention is not limited to this.

Figure 8:
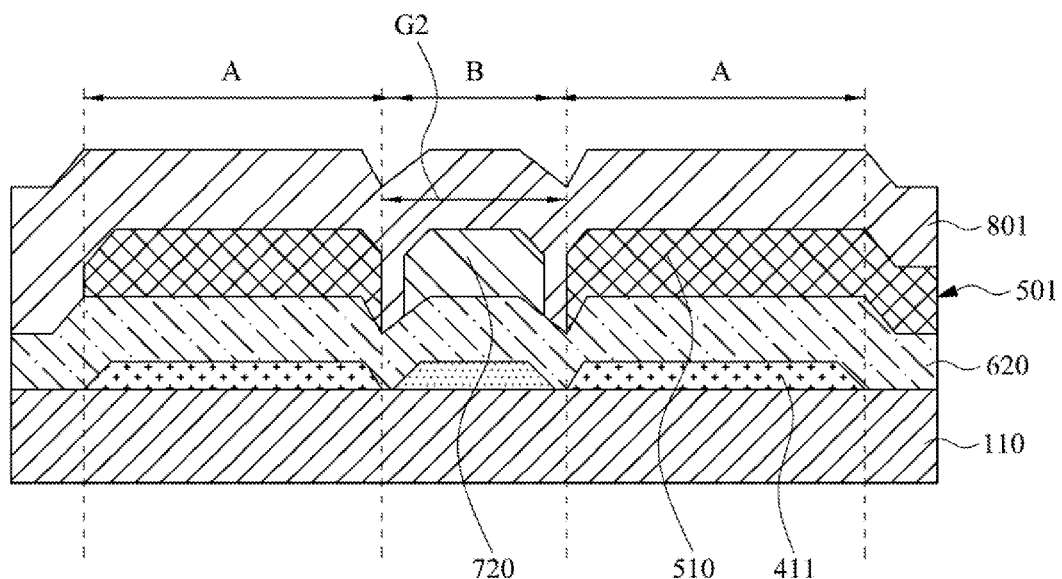
FIG. 8 is a cross-sectional view of another variation of the second embodiment of FIG. 3 along the line I-I.

FIG. 8 is a cross-sectional view of another variation of the second embodiment of FIG. 3 along the line I-I. Referring to FIGS. 3 and 8, based on the characteristic of FIG. 7, in another variation of the second embodiment, the circuit stack structure 300 further includes a second conductor layer 501 and multiple second propping portions 720. The second conductor layer 501 is disposed between the second insulation layer 620 and the protective layer 801, for example directly between the second insulation layer 620 and the protective layer 801. The second conductor layer 501 includes multiple second metal wires 510. These second metal wires 510 are arranged at intervals on the second insulation layer 620, so that a second gap G2 is disposed between any two adjacent second metal wires 510, and each of the second gaps G2 is approximately aligned with one of the first gaps G1. Two ends of each second metal wire 510 are respectively connected to the FPC pad area 160 and the driver chip 120 (FIG. 3). The area of each second metal wire 510 extending from the FPC pad area 160 to the driver chip 120 is also equal to the range of each first area A. The second gap G2 between any two adjacent second metal wires 510 is just equal to the range of each second area B. Each second propping portion 720 is accommodated in the second gap G2 (i.e., the second area B) between any two adjacent second metal wires 510, and is electrically isolated with the second metal wire 510, the FPC pad area 160 and the driver chip 120, for avoiding physical contact. As such, with supporting of the first propping portions 700 and the second propping portions 720, the top surface of the protective layer 801 in the first areas A is approximately coplanar with the top surface of the protective layer 801 in the second areas B.

The protective layer 801 covers the second propping portions 720, the second metal wires 510 and the second insulation layer 620. When the protective layer 801 covers the second propping portions 720 in the second areas B, the protective layer 801 directly contacts the second insulation layer 620 at two opposite sides of the second propping portion 720, so as to prevent the physical contact between the second propping portion 720 and the second metal wire 510 at two sides thereof.

It should be noted that, in variations of the embodiment the material of the first propping portions and the second propping portions may be conducting metal or non-metal materials, such as semiconductor materials like amorphous silicon, but the invention is not limited to this. The thickness (or height) of each of the first propping portions is equal to the thickness (or height) of each of the first metal wires, and the thickness (or height) of each of the second propping portions is equal to the thickness (or height) of each of the second metal wires, but the invention is not limited to this. Each of the first propping portions and the second propping portions has a strip shape and is a dummy metal wire pattern (Dummy pattern). The length of each of the first propping portions and the second propping portions is smaller than the length of each of the first metal wires and the second metal wires extending from the driver chip to the FPC pad area, so as to ensure that the two ends of each of the first propping portions and the second propping portions are not connected to the FPC pad area and the driver chip, but the invention is not limited to this.

Figure 9:
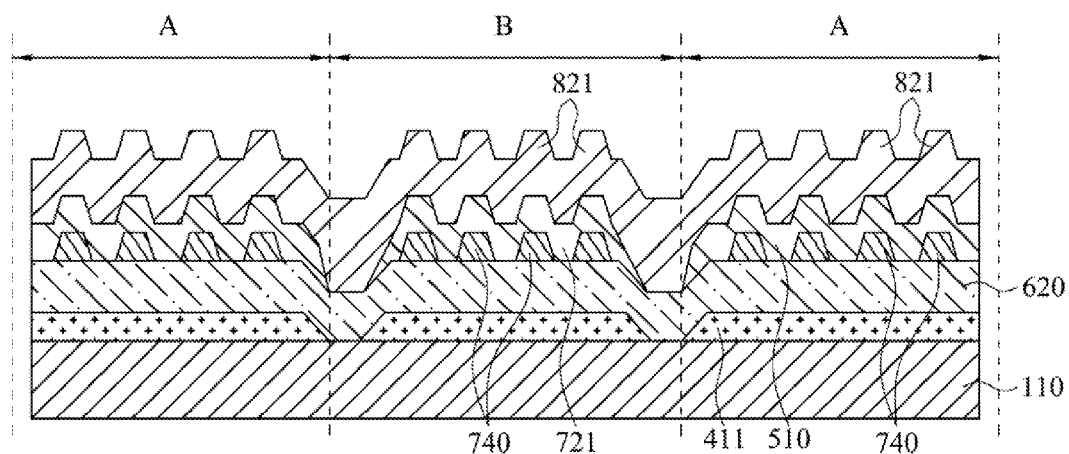
FIG. 9 is a cross-sectional view of the active component array substrate of the invention in a further variation of the second embodiment.

FIG. 9 is a cross-sectional view of the active component array substrate of the invention in a further variation of the second embodiment.

Referring to FIG. 9, based on the characteristic of FIG. 8, in a further variation of the second embodiment, the circuit stack structure 300 further includes multiple fourth propping portions 740 arranged at intervals. These fourth propping portions 740 are not divided into the first areas A and the second areas B, but are arranged at intervals on the second insulation layer 620. More particularly, these fourth propping portions 740 with straight linear shapes are arranged in parallel with each other on the second insulation layer 620 and are covered by the second metal wires 510 and the second propping portions 721. That is, parts of the fourth propping portions 740 are embedded in the second metal wires 510, and other parts of the fourth propping portions 740 are embedded in the second propping portions 721.

As such, based on the fourth propping portions 740, corresponding convex portions are formed on top surfaces of the formed second metal wires 510 and the protective layer 801 in the first areas A, and corresponding convex portions are formed on top surfaces of the formed second propping portions 721 and the protective layer 801 in the second areas B, so that multiple convex portions 821 are formed at intervals on the top surface of the protective layer 801. These convex portions 821 are all distributed in the first areas A and the second areas B of the second area B, corresponding to the fourth propping portions 740, and the top surfaces of these convex portions 821 are approximately coplanar with each other.

Therefore, since the top surface of the protective layer is formed as an uneven surface, the friction difference between the convex portion and the concave portion of the foregoing known structure can be reduced, so as to reduce the friction force due to scratch by the hard object, protect the wiring from the risk of scratch and improve the qualified rate.

It should be noted that, in the variation of the embodiment the material of the first propping portions and the second propping portions may be conducting metal or non-metal materials, such as semiconductor materials like amorphous silicon, and the material of the fourth propping portions may be semiconductor materials, but the invention is not limited to this. The thickness (or height) of each of the first propping portions is equal to the thickness (or height) of each of the first metal wires, and the thickness (or height) of each of the second propping portions is equal to the thickness (or height) of each of the second metal wires, but the invention is not limited to this. The thicknesses (or heights) of all the fourth propping portions are equal to each other, but the invention is not limited to this. Each of the first propping portions and the second propping portions has a strip shape and is a dummy metal wire pattern (Dummy pattern). The length of each of the first propping portions and the second propping portions is smaller than the length of each of the first metal wires and the second metal wires extending from the driver chip to the FPC pad area, so as to ensure that the two ends of each of the first propping portions and the second propping portions are not connected to the FPC pad area and the driver chip, but the invention is not limited to this.

Figure 10:
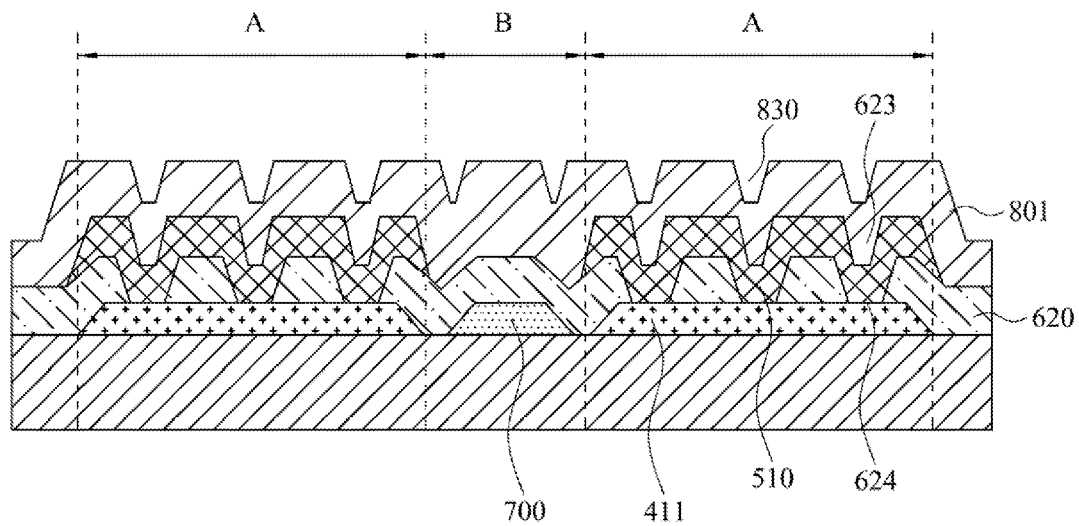
FIG. 10 is a cross-sectional view of the active component array substrate of the invention in a further variation of the second embodiment.

FIG. 10 is a cross-sectional view of the active component array substrate of the invention in still a further variation of the second embodiment. Referring to FIG. 10, in still a further variation of the second embodiment, the second insulation layer 620 includes multiple through openings 624 arranged at intervals in the first areas A. In this variation, these through openings 624 are only disposed in the first areas A of the second insulation layer 620. When the second metal wires 510 are formed in the first areas A of the second insulation layer 620, by means of the accommodation space of the through openings 624, the second metal wires 510 is accommodated in the through openings 624 and contact the first metal wires 411 in the same area thereof in the through openings 624.

Due to the through openings 624 of the second insulation layer 620, corresponding concave portions are formed on top surfaces of the formed second metal wires 510 and the protective layer 801 in the first areas A. More particularly, multiple concave portions 623 arranged at intervals are formed on the top surfaces of the second metal wires 510 in the first areas A. These concave portions 623 are approximately aligned with these through openings 624 one to one. When the protective layer 801 is formed, multiple concave openings 830 approximately aligned with these concave portions 623 are formed on the top surface of the protective layer 801 in the first areas A. Furthermore, based on the first propping portions 700, corresponding convex portions are formed on the top surface of the formed protective layer 801 in the second areas B, so that the top surface of the protective layer 801 in the first areas A is approximately coplanar with the top surface of the protective layer 801 in the second areas B.

Therefore, since the top surface of the protective layer 801 has concave openings 830 corresponding to the through openings 624, the contact area of the protective layer 801 scratched by a hard object is reduced, so as to protect the wiring from the risk of scratch and improve the qualified rate. Furthermore, since each of the second metal wires 510 is electrically connected with one first metal wire 411, the current applied to the transition line area 200 can evenly pass through the first metal wires 411 and the second metal wires 510, so as to reduce the resistance.

It should be understood that, in variations of the embodiment the material of the first propping portions may be conducting metal or non-metal materials, such as semiconductor materials like amorphous silicon. The thickness (or height) of each of the first propping portions is equal to the thickness (or height) of each of the first metal wires, but the invention is not limited to this. The depths of all the through openings are equal to each other, but the invention is not limited to this. Each of the first propping portions has a strip shape and is a dummy metal wire pattern (Dummy pattern). The length of each of the first propping portion is smaller than the length of each of the first metal wires extending from the driver chip to the FPC pad area, so as to ensure that the two ends of the first propping portions are not connected to the FPC pad area and the driver chip, but the invention is not limited to this.

Figure 11:
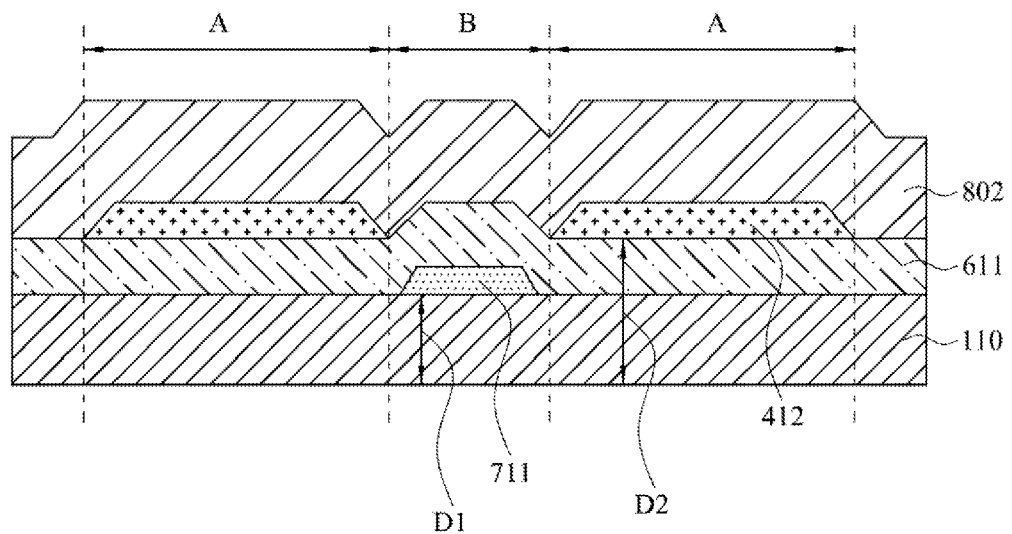
FIG. 11 is a cross-sectional view of a variation of the third embodiment of FIG. 3 along the line I-I.

FIG. 11 is a cross-sectional view of a variation of a third embodiment of FIG. 3 along the line I-I. Referring to FIGS. 3 and 11, the first propping portions 711 are disposed on the glass substrate 110. The insulation layer (hereafter referred to as a first insulation layer 611 in the third embodiment) covers the first propping portions 711. The first metal wires 412 are disposed between the first insulation layer 611 and the protective layer 802, so that the first insulation layer 611 is disposed between the first conductor layer 402 and the glass substrate 110 in the first areas A, and is disposed between the each of the first propping portions 711 and the protective layer 802. Therefore, in the third embodiment, since the first propping portions 711 are not disposed in the first conductor layer 402, the first propping portions 711 are not coplanar with the first metal wires 412. That is the minimum vertical distance D1 from bottom surfaces of the first propping portions 711 to a reference surface (e.g., the bottom surface of the glass substrate 110) is not equal to a minimum vertical distance D2 from bottom surfaces of the first metal wires 412 to the reference surface (e.g., the bottom surface of the glass substrate 110).

Furthermore, since the first insulation layer 611 covers the first propping portions 711 and the first metal wires 412 are disposed between the first insulation layer 611 and the protective layer 802, the first insulation layer 611 can prevent physical contact between the first propping portions 711 and two first metal wire 412 adjacent thereto in the second areas B.

It should be understood that, in variations of the embodiment the material of the first propping portions may be conducting metal or non-metal materials, such as semiconductor materials like amorphous silicon. The thickness (or height) of each of the first propping portions is equal to the thickness (or height) of each of the first metal wires, but the invention is not limited to this. Each of the first propping portions has a strip shape and is a dummy metal wire pattern (Dummy pattern). The length of each of the first propping portion is smaller than the length of each of the first metal wires extending from the driver chip to the FPC pad area, so as to ensure that the two ends of the first propping portions are not connected to the FPC pad area and the driver chip, but the invention is not limited to this.

Figure 12:
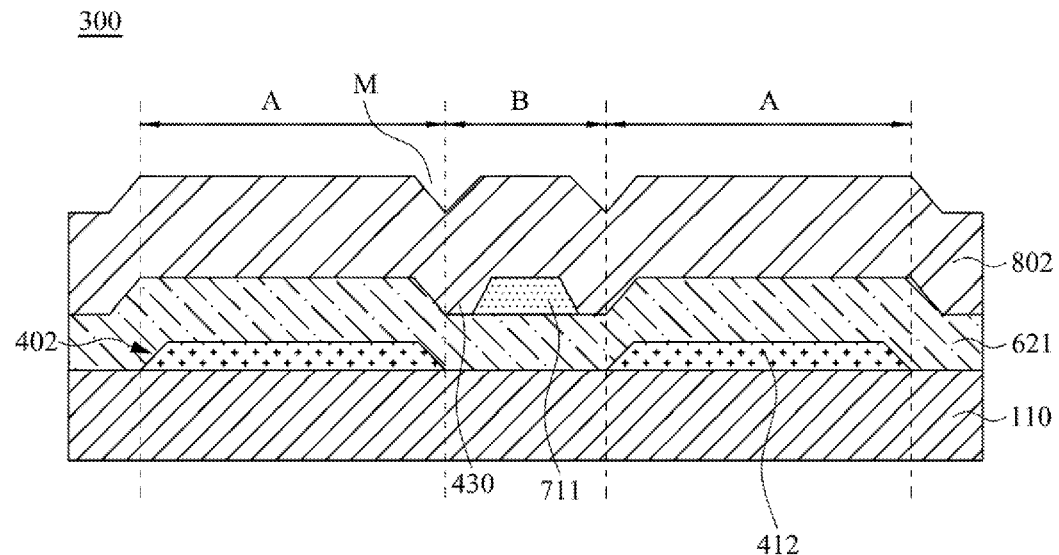
FIG. 12 is a cross-sectional view of another variation of the third embodiment of FIG. 3 along the line I-I.

FIG. 12 is a cross-sectional view of another variation of the third embodiment of FIG. 3 along the line I-I. Referring to FIGS. 3 and 12, in another variation of a third embodiment, these first metal wires 412 are disposed on the glass substrate 110. The insulation layer (hereafter referred to as a second insulation layer 621 in the third embodiment) covers the glass substrate 110 and the first metal wires 412, for example directly covers the glass substrate 110 and the first metal wires 412. The first propping portions 711 disposed on the second insulation layer 621 are between the second insulation layer 621 and the protective layer 802, so that, the first propping portions 711 are not coplanar with the first metal wires 412.

Additionally, the second insulation layer 621 is disposed between the first conductor layer 402 and the protective layer 802 in the first areas A, and is disposed between the glass substrate 110 and the first propping portion 711 in the second areas B, so that any two adjacent first metal wires 412 are directly isolated physically in the second areas B.

Moreover, since the second insulation layer 621 is disposed between any two adjacent first metal wires 412, the first propping portions 711 cannot physically contact the two adjacent first metal wires 412.

As such, since the protective layer 802 fills the concave portions 430 between two opposite sides of the first propping portion 711 and the second insulation layer 621, concave marks M aligned with the concave portions 430 are also formed on the top surface of the protective layer 802. Therefore, the top surface of the protective layer 802 in the second areas B is defined between any two adjacent concave marks M on the top surface of the protective layer 802.

It should be understood that, in variations of the embodiment the material of the first propping portions may be conducting metal or non-metal materials, such as semiconductor materials like amorphous silicon. The thickness (or height) of each of the first propping portions is equal to the thickness (or height) of each of the first metal wires, but the invention is not limited to this. Each of the first propping portions has a strip shape and is a dummy metal wire pattern (Dummy pattern). The length of each of the first propping portion is smaller than the length of each of the first metal wires extending from the driver chip to the FPC pad area, so as to ensure that the two ends of the first propping portions are not connected to the FPC pad area and the driver chip, but the invention is not limited to this.

Figure 13:
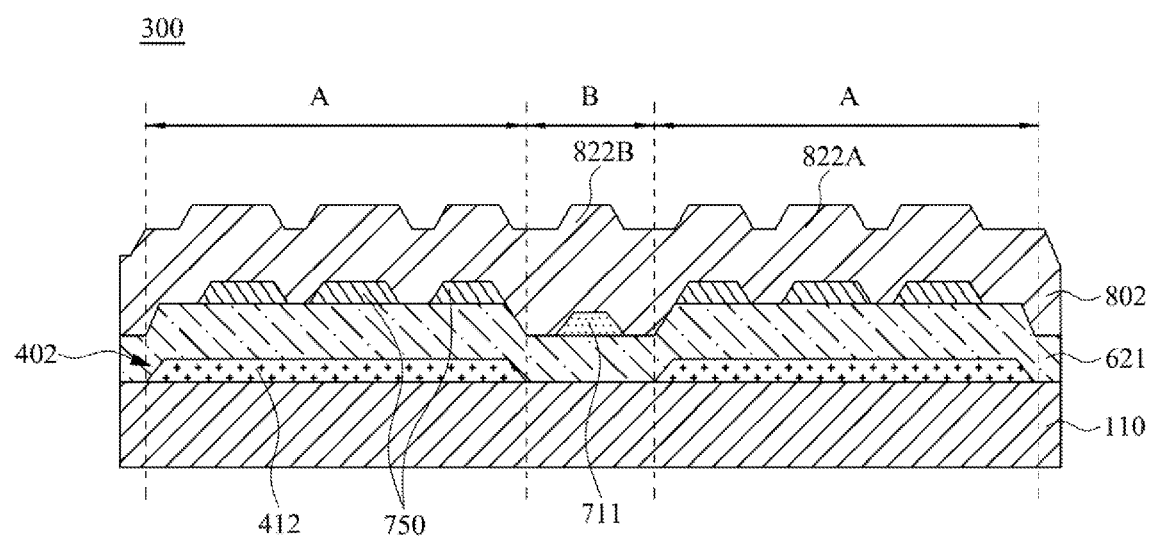
FIG. 13 is a cross-sectional view of the active component array substrate of the invention in a further variation of the third embodiment.

FIG. 13 is a cross-sectional view of the active component array substrate of the invention in a further variation of the third embodiment. Referring to FIG. 13, based on the characteristic of FIG. 12, in a further variation of the third embodiment, the circuit stack structure 300 further includes multiple fifth propping portions 750 arranged at intervals. These fifth propping portions 750 are arranged on the second insulation layer 621. In this variation, these fifth propping portions 750 are only disposed in the first areas A of the second insulation layer 621. More particularly, these fifth propping portions 750 with straight linear shapes are arranged in parallel with each other in the first areas A of the second insulation layer 621, and are covered by the protective layer 802. That is, these fifth propping portions 750 are embedded in the protective layer 802.

As such, during manufacture, the first conductor layer 402, the second insulation layer 621, these fifth propping portions 750 and first propping portions 711 and the protective layer 802 are sequentially formed on the glass substrate 110. Based on the first propping portions 711 and fifth propping portions 750, uneven surfaces corresponding to the fifth propping portions 750 and first propping portions 711 are formed on the top surface of the protective layer 802. That is, multiple convex portions 822A and 822B are arranged at intervals on the top surface of the protective layer 802. These convex portions 822A and 822B are all distributed in the first areas A and the second areas B of the protective layer 802, and the top surfaces of the convex portions 822A and 822B are approximately coplanar with each other.

Therefore, since the top surface of the protective layer is formed as an uneven surface, the friction difference between the convex portion and the concave portion of the foregoing known structure can be reduced, so as to reduce the friction force due to scratch by the hard object, protect the wiring from the risk of scratch and improve the qualified rate.

It should be understood that, in the variation of the embodiment the material of the first propping portions may be conducting metal or non-metal materials, such as semiconductor materials like amorphous silicon, and the material of the fifth propping portions may be semiconductor materials, but the invention is not limited to this. The thickness (or height) of each of the first propping portions is equal to the thickness (or height) of each of the first metal wires, but the invention is not limited to this. The thicknesses (or heights) of all the fifth propping portions are equal to each other, but the invention is not limited to this. Each of the first propping portions has a strip shape and is a dummy metal wire pattern (Dummy pattern). The length of each of the first propping portion is smaller than the length of each of the first metal wires extending from the driver chip to the FPC pad area, so as to ensure that the two ends of the first propping portions are not connected to the FPC pad area and the driver chip, but the invention is not limited to this.

Figure 14:
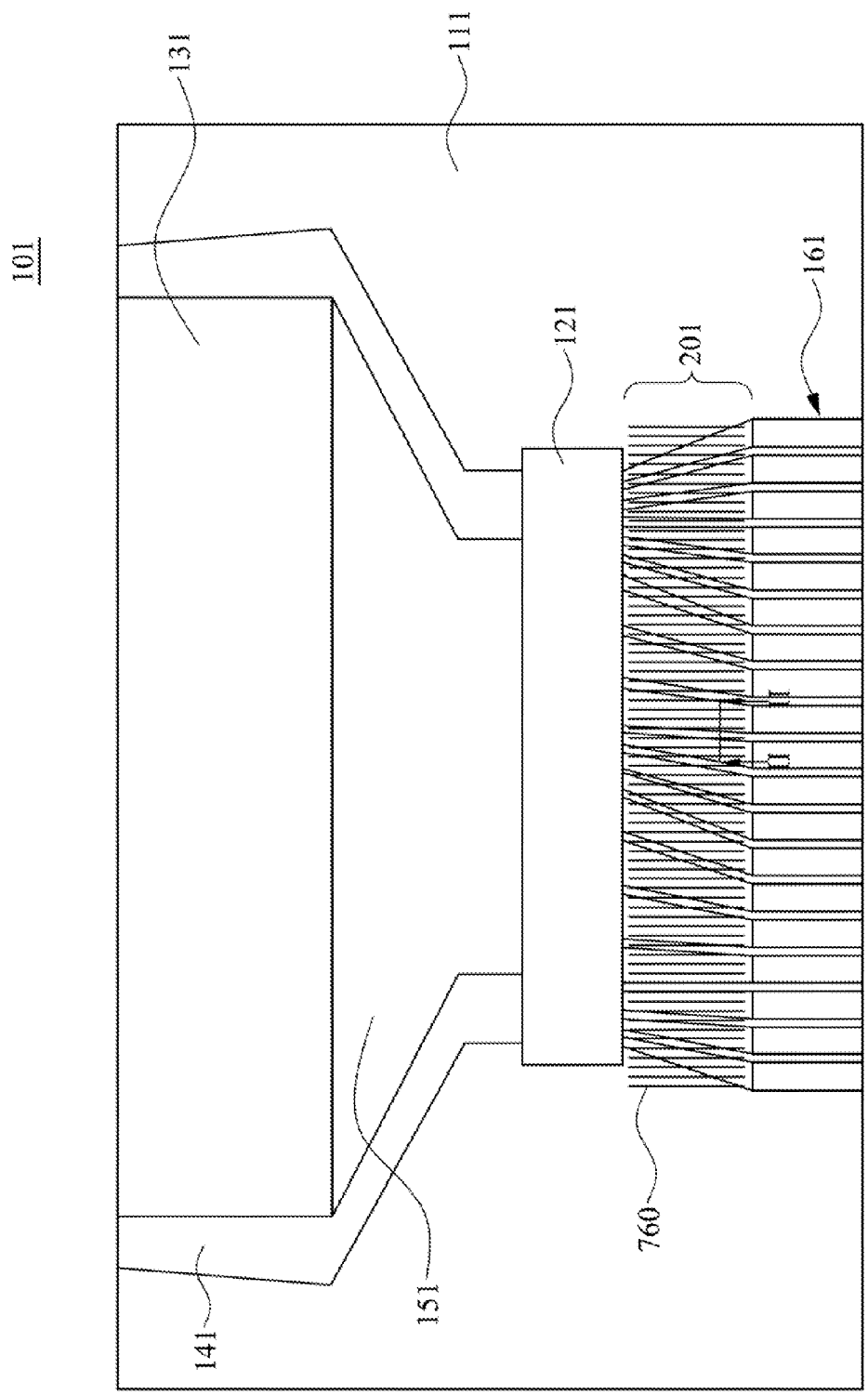
FIG. 14 is a partially top view of an active component array substrate according to another embodiment of the invention.

FIG. 14 is a partially top view of an active component array substrate 101 according to another embodiment of the invention.

Referring to FIGS. 1 and 14, the active component array substrate 101 includes a glass substrate 111, a driver chip 121, a pixel array 131, a scan line area (scan lines) 141, a data line area (source lines or data lines) 151 and a flexible printed circuit pad area 161. The data line area 151, the scan line area 141 the pixel array 131, the driver chip 121 and the flexible printed circuit pad area 161 are all arranged on the glass substrate 111. The details and relative relationships of the data line area 151, the scan line area 141, the pixel array 31, the driver chip 121 and the FPC pad area 161 are the same as those related descriptions of FIG. 3, and thus will not be described here anymore.

Figure 15:
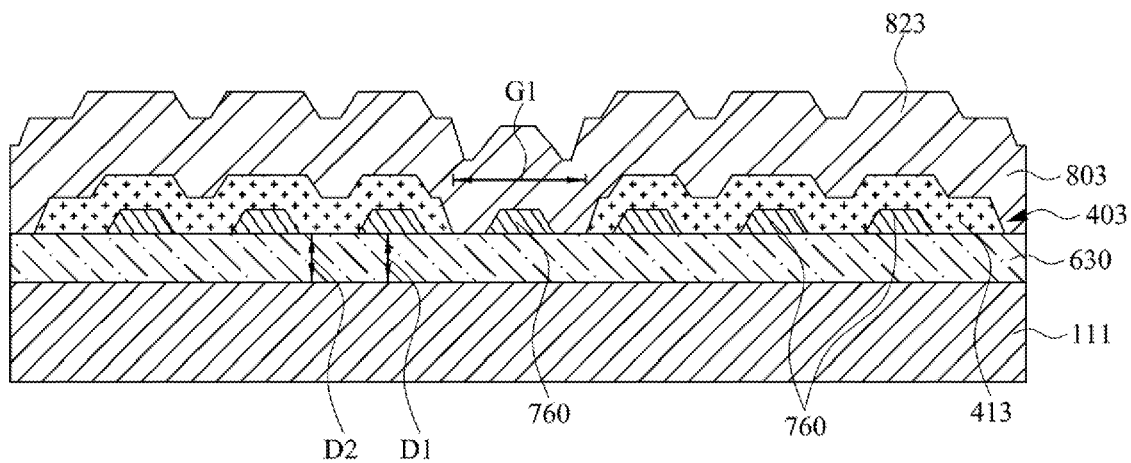
FIG. 15 is a cross-sectional view of a fourth embodiment of FIG. 14 along a line II-II.

FIG. 15 is a cross-sectional view of a fourth embodiment of FIG. 14 along a line II-II. Referring to FIGS. 14 and 15, The transition line area 201 includes a circuit stack structure 301. The circuit stack structure 301 includes a first conductor layer 403, a third insulation layer 630, multiple sixth propping portions 760 and a protective layer 803. The first conductor layer 403 and the third insulation layer 630 are both disposed on the glass substrate 111. The first conductor layer 403 includes multiple first metal wires 413 arranged at intervals. A first gap G1 is disposed between any two adjacent first metal wires 413, and two ends of each of the first metal wires 413 are respectively connected to the FPC pad area 161 and the driver chip 121 (FIG. 14). The sixth propping portions 760 having long and narrow shapes are arranged in parallel with each other on the third insulation layer 630, and are electrically isolated with the first metal wires 413, the FPC pad area 161 and the driver chip 121. The protective layer 803 covering the first conductor layer 403, the third insulation layer 630 and the sixth propping portions 760 is disposed at the outermost side of the circuit stack structure 301 opposite to the glass substrate 111. Based on the sixth propping portions 760, multiple convex portions 823 approximately aligned with the sixth propping portions 760 one to one are formed on the top surface of the protective layer 803.

Therefore, since the top surface of the protective layer is formed as an uneven surface, the friction difference between the convex portion and the concave portion of the foregoing known structure can be reduced, so as to reduce the friction force due to scratch by the hard object, protect the wiring from the risk of scratch and improve the qualified rate.

Referring to FIGS. 14 and 15, in a fourth embodiment of another implementation, the third insulation layer 630 is directly and completely disposed on the glass substrate 111, between the first metal wire 413 and the glass substrate 111. The first conductor layer 403 is disposed between the third insulation layer 630 and the protective layer 803, and even more these first metal wires 413 are directly disposed between the third insulation layer 630 and the protective layer 803.

These sixth propping portions 760 and first metal wires 413 are all disposed on the third insulation layer 630, and even more the sixth propping portions 760 and first metal wires 413 are directly disposed on the third insulation layer 630, and the sixth propping portion 760 is embedded in the first metal wire 413 and the protective layer 803. Therefore, the first propping portions 760 are coplanar with the first metal wires 413. That is, the minimum vertical distance D1 from bottom surfaces of the first propping portions 760 to a reference surface (e.g., the top surface of the glass substrate 111) is equal to a minimum vertical distance D2 from bottom surfaces of the first metal wires 413 to the reference surface (e.g., the top surface of the glass substrate 111). Similarly, since the third insulation layer 630 is directly and completely disposed on the glass substrate 111 and the sixth propping portions 760 are disposed on the third insulation layer 630, these sixth propping portions 760 are coplanar with each other.

Furthermore, in this embodiment, when the protective layer 803 covers the third insulation layer 630, the first metal wires 413 and the sixth propping portions 760, the protective layer 803 covers at least one sixth propping portion 760 in the first gap G1, and directly contacts the third insulation layer 630 at two opposite sides of the sixth propping portion 760, so as to avoid physical contact between the sixth propping portion 760 and the first metal wires 413 disposed at two sides thereof.

During manufacture, the third insulation layer 630, the sixth propping portions 760, the first conductor layer 403 and the protective layer 803 are sequentially formed on the glass substrate 111. Based on the sixth propping portions 760 and the first metal wires 413, these convex portions 823 are formed on the top surface of the formed protective layer 803.

It should be understood that, in variations of the embodiment the material of the sixth propping portions may be semiconductor materials, such as amorphous silicon, but the invention is not limited to this. The thicknesses (or heights) of all the sixth propping portions are not necessary to be the same. Each of the sixth propping portions has a strip shape and is a dummy metal wire pattern (Dummy pattern). The length of each of the sixth propping portions is smaller than the length of each of the first metal wires extending from the driver chip to the FPC pad area, so as to ensure that the two ends of each of the sixth propping portions do not contact the FPC pad area and the driver chip, but the invention is not limited to this.

Figure 16:
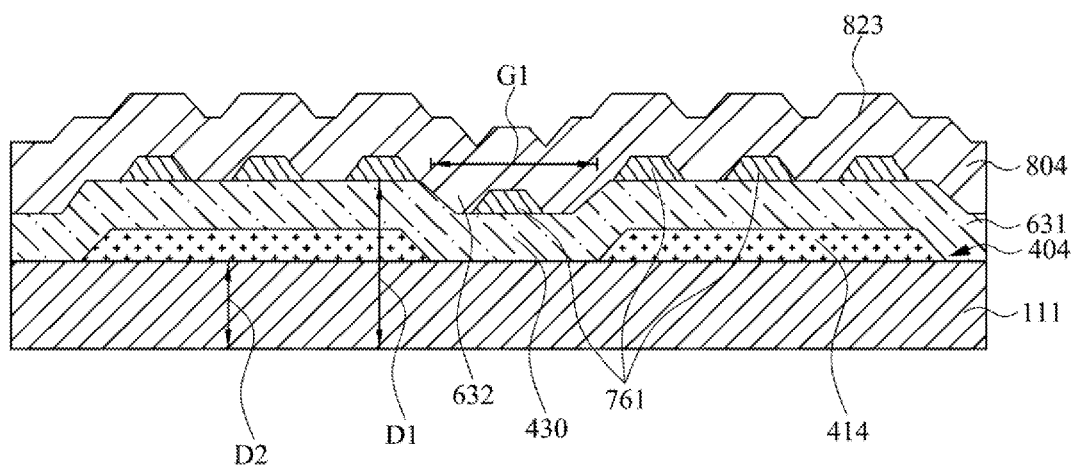
FIG. 16 is a cross-sectional view of a fifth embodiment of FIG. 14 along the line II-II.

FIG. 16 is a cross-sectional view of a fifth embodiment of FIG. 14 along a line II-II. Referring to FIGS. 14 and 16, In the fifth embodiment of another implementation, the first conductor layer 404 is disposed between the glass substrate 111 and the third insulation layer 631, and even more, these first metal wires 414 are directly disposed between the glass substrate 111 and the third insulation layer 631. The sixth propping portions 761 are arranged at intervals between the third insulation layer 631 and the protective layer 804, and are embedded in the protective layer 804.

Therefore, since the sixth propping portions 761 are not disposed in the first conductor layer 404, the sixth propping portions 761 are not coplanar with the first metal wires 414. That is the minimum vertical distance D1 from bottom surfaces of the sixth propping portions 761 to a reference surface (e.g., the bottom surface of the glass substrate 111) is not equal to a minimum vertical distance D2 from bottom surfaces of the first metal wires 414 to the reference surface (e.g., the bottom surface of the glass substrate 111).

Furthermore, the third insulation layer 631 disposed between the first conductor layer 404 and the protective layer 804 covers these first metal wires 414, and contacts the glass substrate 111 in the first gap G1, so as to avoid the physical contact between any two adjacent first metal wires 414.

During manufacture, the first conductor layer 404, the third insulation layer 631, the sixth propping portions 761 and the protective layer 804 are sequentially formed on the glass substrate 111. Based on the sixth propping portions 761 and the first metal wires 414, these convex portions 823 are formed on the top surface of the formed protective layer 803.

The third insulation layer 631 fills the concave portion 430 between any two adjacent first metal wires 414, so that a groove 632 corresponding to the concave portion 430 is formed at a position of the third insulation layer 631 corresponding to the first gap G1, and at least one sixth propping portion 761 is accommodated in the groove 632, making these sixth propping portions 761 not be coplanar with each other.

It should be understood that, in variations of the embodiment the material of the sixth propping portions may be conducting metal or non-metal materials, such as semiconductor materials like amorphous silicon. The thicknesses (or heights) of all the sixth propping portions are not necessary to be the same. Each of the sixth propping portions has a strip shape and is a dummy metal wire pattern (Dummy pattern). The length of each of the sixth propping portions is smaller than the length of each of the first metal wires extending from the driver chip to the FPC pad area, so as to ensure that the two ends of each of the sixth propping portions are not connected to the FPC pad area and the driver chip, but the invention is not limited to this.

Figure 17:
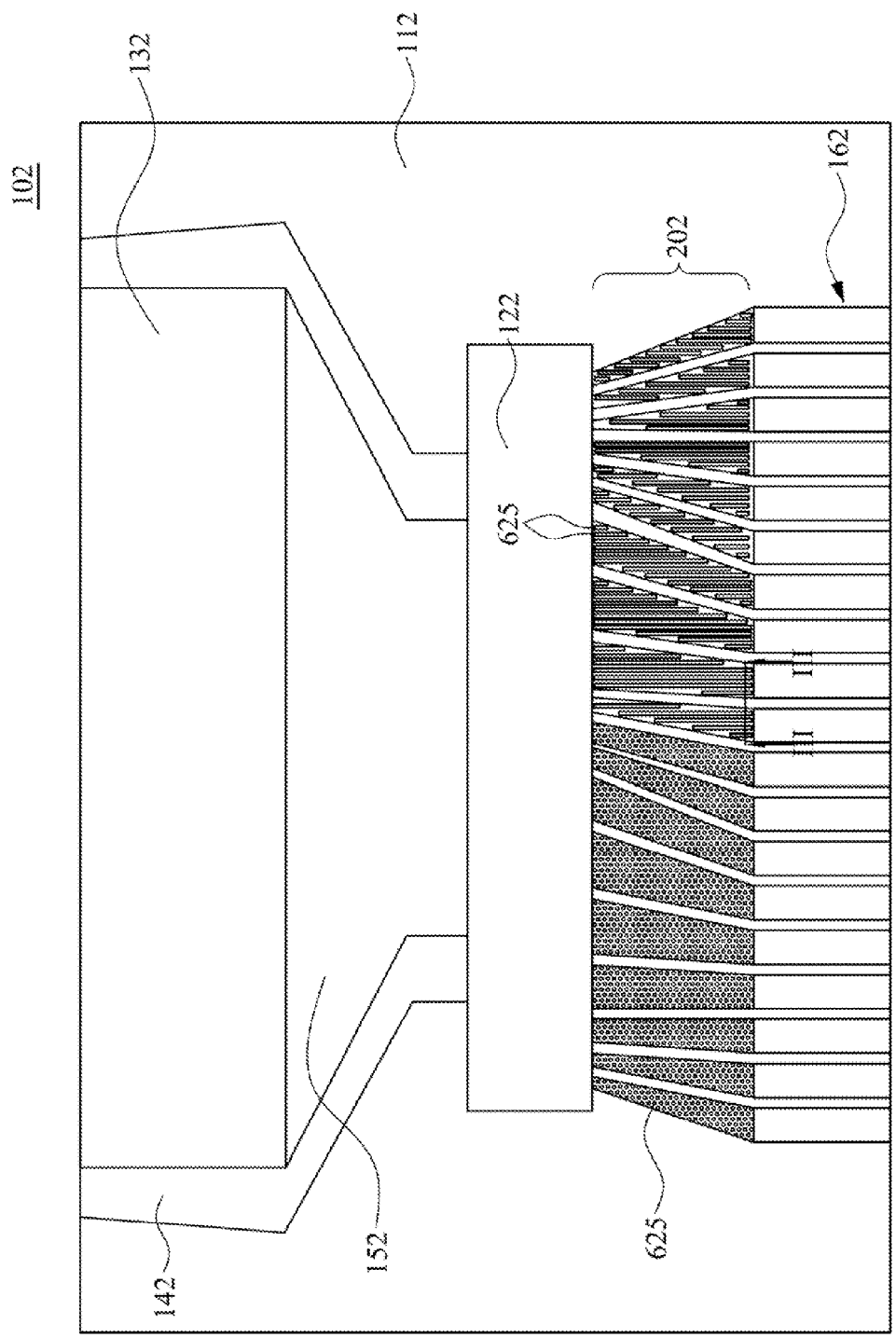
FIG. 17 is a partially top view of an active component array substrate according to a further embodiment of the invention.

FIG. 17 is a partially top view of an active component array substrate 102 according to another embodiment of the invention. Referring to FIGS. 1 and 17, the active component array substrate 102 includes a glass substrate 112, a driver chip 122, a pixel array 132, a scan line area (scan lines) 142, a data line area (source lines or data lines) 152 and a flexible printed circuit pad area 162. The data line area 152, the scan line area 142, the pixel array 132 (FIG. 1), the driver chip 122 and the FPC pad area 162 are all arranged on the glass substrate 112. The details and relative relationships of the data line area 152, the scan line area 142, the pixel array 132 (FIG. 1), the driver chip 122 and the FPC pad area 162 are the same as those related descriptions of FIG. 3, and thus will not be described here anymore.

Figure 18:
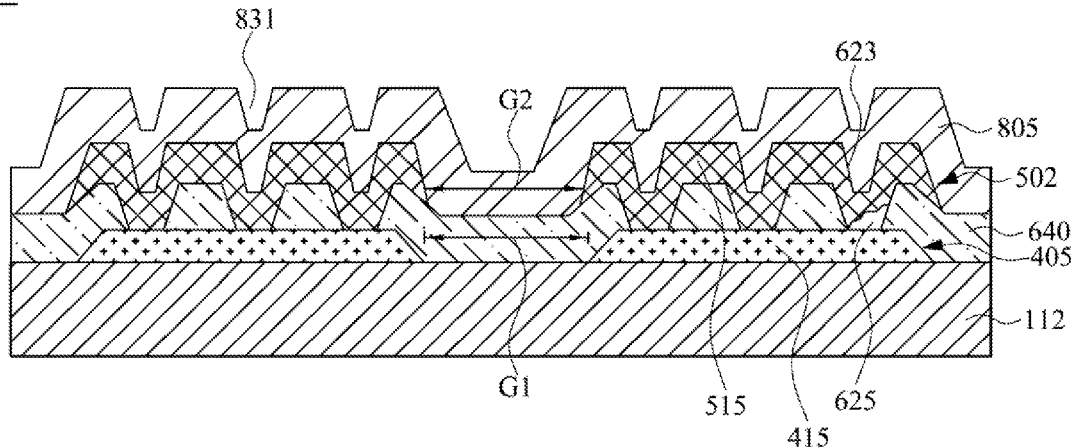
FIG. 18 is a cross-sectional view of a sixth embodiment of FIG. 17 along a line II-III.

FIG. 18 is a cross-sectional view of a sixth embodiment of FIG. 17 along a line III-III.

Referring to FIGS. 17 and 18, the transition line area 202 includes a circuit stack structure 302. The circuit stack structure 302 includes a first conductor layer 405, a second conductor layer 502, a fourth insulation layer 640 and a protective layer 805. The first conductor layer 405, the second conductor layer 502 and the fourth insulation layer 640 are all disposed on the glass substrate 112. The first conductor layer 405 includes multiple first metal wires 415 arranged at intervals. A first gap G1 is disposed between any two adjacent first metal wires 415, and two ends of each of the first metal wires 415 are respectively connected to the FPC pad area 162 and the driver chip 122 (FIG. 17).

The fourth insulation layer 640 covers the glass substrate 112 and the first metal wires 415, including multiple through openings 625 arranged at intervals on the fourth insulation layer 640. These through openings 625 expose the first metal wires 415, meaning that no through opening is disposed at a position of the fourth insulation layer 640 corresponding to the first gap G1. The second conductor layer 502 includes multiple second metal wires 511 arranged at intervals. A second gap G2 is disposed between any two adjacent second metal wires 511. The second metal wires 511 are approximately aligned with the first metal wires 415, and the second gaps G2 are approximately aligned with the first gaps G1. These second metal wires 511 are arranged at intervals on the fourth insulation layer 640, and the second metal wires 511 are approximately aligned with the first metal wires 415. Through the accommodation space of the through openings 625, the second metal wires 511 fill the through openings 625 and contact the corresponding first metal wires 415 in the through openings 625. The protective layer 805 covering the fourth insulation layer 640 and the second metal wires 511 is disposed at the outermost side of the circuit stack structure 302 opposite to the glass substrate 112. Through the accommodation space of the through openings 625, multiple concave openings 831 corresponding to the through openings 625 are formed on a top surface of the protective layer 805.

During manufacture, the first conductor layer 405, the fourth insulation layer 640, the second conductor layer 502 and the protective layer 805 are sequentially formed on the glass substrate 112. After the fourth insulation layer 640 is formed on the first conductor layer 405 and the glass substrate 112, these through openings 625 are formed on a position of the fourth insulation layer 640 corresponding to the first metal wires 415 so that a single first metal wire 415 faces one or more through openings 625. Therefore the formed second metal wires 511 fill and even fill up the through openings 625, so as to be electrically connected with the first metal wires 415.

Due to the through openings 625 of the fourth insulation layer 640 corresponding concave portions are formed on the corresponding top surfaces of the formed second metal wires 511 and the protective layer 805. More particularly, multiple concave portions 623 arranged at intervals are formed on the top surfaces of the second metal wires 511. These concave portions 623 are approximately aligned with these through openings 625 one to one. When the protective layer 805 is formed, multiple concave openings 831 approximately aligned with these concave portions 623 one to one are formed on the corresponding top surfaces of the protective layer 805.

Therefore, since the top surface of the protective layer 805 has concave openings 831 corresponding to the through openings 625, the contact area of the protective layer 805 scratched by a hard object is reduced, so as to protect the wiring from the risk of scratch and improve the qualified rate.

Furthermore, since each of the second metal wires 511 is electrically connected with one first metal wire 415, the current applied to the transition line area 202 can evenly pass through the first metal wires 415 and the second metal wires 511, so as to reduce the resistance.

In view of the above, the invention can minimize the differences between the convex portion and the concave portion on the transition line area of the foregoing known structure, the friction force due to scratch by the hard object is reduced, which is beneficial to protect the wiring from the risk of scratch, improve the qualified rate, and avoid increase of the manufacture or maintain cost.

Although the invention has been disclosed with reference to the above embodiments, these embodiments are not intended to limit the invention. It will be apparent to those of skills in the art that various modifications and variations can be made without departing from the spirit and scope of the invention. Therefore, the scope of the invention shall be defined by the appended claims.

What is claimed is:

1. A circuit stack structure disposed on an active component array substrate, comprising first areas and second areas which are alternatively arranged, wherein the circuit stack structure comprises:
   a first conductor layer overlapped on a glass substrate of the active component array substrate, comprising a plurality of first metal wires arranged at intervals, wherein an area range of each first metal wire is consistent with an area range of each of the first areas, and an area range of a gap between any two adjacent first metal wires is consistent with an area range of the second area;
   a plurality of first propping portions respectively disposed in the second areas and electrically isolated with the first metal wires; and
   a protective layer covering the first conductor layer and the first propping portions, wherein at least with supporting by the first propping portions, top surfaces of the protective layer in the first areas are coplanar with top surfaces of the protective layer in the second areas.

2. The circuit stack structure of claim 1, wherein each of the first propping portions is coplanar with each of the first metal wires.

3. The circuit stack structure of claim 1, wherein each of the first propping portions fully fills up the gap between the two adjacent first metal wires.

4. The circuit stack structure of claim 1, further comprising:
   a first insulation layer disposed between the first conductor layer and the glass substrate,
   wherein the protective layer contacts the first insulation layer in the second areas, and avoids a physical contact between each of the first propping portions and the two first metal wires adjacent thereto.

5. The circuit stack structure of claim 1, further comprising:
   a plurality of third propping portions respectively having a linear shape, which are disposed in each of the first areas, arranged at intervals and in parallel with each other on the first insulation layer, and are embedded in each of the first metal wires.

6. The circuit stack structure of claim 1, further comprising:
   a second insulation layer disposed between the first conductor layer and the protective layer,
   wherein the second insulation layer contacts the glass substrate in the second areas, and avoids the physical contact between each of the first propping portions and the two first metal wires adjacent thereto.

7. The circuit stack structure of claim 6, further comprising:
   a second conductor layer disposed between the second insulation layer and the protective layer, comprising a plurality of second metal wires arranged at intervals, wherein an area range of each second metal wire is consistent with the area range of the first area, and an area range of a gap between any two adjacent second metal wires is consistent with the area range of the second area; and
   a plurality of second propping portions disposed between the second insulation layer and the protective layer, respectively disposed in the second areas, and electrically isolated with the second metal wires.

8. The circuit stack structure of claim 6, further comprising:
   a plurality of fourth propping portions arranged at intervals on the second insulation layer, disposed in the first areas and the second areas, and embedded in the second metal wires and the second propping portions.

9. The circuit stack structure of claim 6, wherein the top surface of the protective layer comprises a plurality of concave openings arranged at intervals,
   the second insulation layer comprises a plurality of through openings arranged at intervals only in each of the first areas, and each of the second metal wires fully fills in the a plurality of through openings and contacts the first metal wire in the through openings.

10. The circuit stack structure of claim 1, wherein each of the first propping portions is not coplanar with each of the first metal wires.

11. The circuit stack structure of claim 10, wherein each of the first propping portions is disposed on the glass substrate; and
    the circuit stack structure further comprises:
    a first insulation layer disposed between the first conductor layer and the glass substrate in each of the first areas and disposed between each of the first propping portions and the protective layer in each of the second areas, which avoids the physical contact between each of the first propping portions and two first metal wires adjacent thereto.

12. The circuit stack structure of claim 10, wherein each of the metal wires is disposed on the glass substrate; and
    the circuit stack structure further comprises:
    a second insulation layer disposed between the first conductor layer and the protective layer in each of the first areas and disposed between the glass substrate and each of the first propping portions in each of the second areas, which avoids the physical contact between each of the first propping portions and two first metal wires adjacent thereto.

13. The circuit stack structure of claim 12, further comprising:
    a plurality of fifth propping portions respectively having a linear shape, which are disposed in one of the first areas, arranged at intervals and in parallel with each other on the second insulation layer, and are embedded in the protective layer.

14. A circuit stack structure disposed on an active component array substrate, comprising:

a third insulation layer disposed on a glass substrate of the active component array substrate;

a first conductor layer overlapped on the third insulation layer, comprising a plurality of first metal wires arranged at intervals;

a plurality of sixth propping portions respectively having a long and narrow shape, which are arranged in parallel with each other on the third insulation layer and are electrically isolated with the first metal wires; and a protective layer covering the first conductor layer and sixth propping portions.

15. The circuit stack structure of claim 14, wherein the third insulation layer is disposed between the first metal wires and the glass substrate, and the sixth propping portions and the first metal wires are directly disposed on the third insulation layer, wherein the sixth propping portions are embedded in the first metal wires and the protective layer.

16. The circuit stack structure of claim 14, wherein the protective layer directly contacts the third insulation layer in a gap between any two adjacent first metal wires, covers one of the sixth propping portions, and avoids a physical contact between the two adjacent first metal wires.

17. The circuit stack structure of claim 14, wherein the third insulation layer is disposed between the first conductor layer and the protective layer, covers the first metal wires, contacts the glass substrate in a gap between any two adjacent first metal wires, and avoids the physical contact between the two adjacent first metal wires.

18. The circuit stack structure of claim 14, wherein the protective layer further covers the third insulation layer, and the sixth propping portions are embedded in the protective layer.

19. A circuit stack structure disposed on an active component array substrate, comprising:

a first conductor layer comprising a plurality of first metal wires, wherein the first metal wires are arranged at intervals on a glass substrate of the active component array substrate;

a fourth insulation layer covering the glass substrate and the first metal wires and comprising a plurality of through openings arranged at intervals on the insulation layer, wherein the through openings only oriented to the first metal wires;

a second conductor layer comprising a plurality of second metal wires, wherein the second meta wires are arranged at intervals on the fourth insulation layer, and each of the second metal wires fills the through openings and contacts the corresponding first metal wire in the through openings; and a protective layer covering the fourth insulation layer and the second metal wires, such that a plurality of concave openings respectively aligned with the through openings are formed on a top surface of the protective layer.

20. The circuit stack structure of claim 19, wherein a plurality of concave portions are formed on a top surface of each of the second metal wires, and each of the concave portions is aligned with one of the through openings and one of the concave openings.

* * * * *